US010254189B2

(12) United States Patent
Yoshida et al.

(10) Patent No.: US 10,254,189 B2
(45) Date of Patent: Apr. 9, 2019

(54) STATIC EXPANSION METHOD (71) Applicant: NATIONAL INSTITUTE OF ADVANCED INDUSTRIAL SCIENCE AND TECHNOLOGY, Tokyo (JP)

(72) Inventors: Hajime Yoshida, Tsukuba (JP); Kenta Arai, Tsukuba (JP); Tokihiko Kobata, Tsukuba (JP)

(73) Assignee: NATIONAL INSTITUTE OF ADVANCED INDUSTRIAL SCIENCE AND TECHNOLOGY, Chiyoda-Ku, Tokyo (JP)

(*) Notice: Subject to any disclaimer, the term of this patent is extended or adjusted under 35 U.S.C. 154(b) by 0 days.

(21) Appl. No.: 15/723,752

(22) Filed: Oct. 3, 2017

(65) Prior Publication Data
US 2018/0038758 A1 Feb. 8, 2018

Related U.S. Application Data (63) Continuation of application No. 14/443,904, filed as application No. PCT/JP2013/080551 on Nov. 12, 2013, now abandoned.

(30) Foreign Application Priority Data

Nov. 21, 2012 (JP) .................................. 2012-254849

(51) Int. Cl.
G01M 3/00 (2006.01)
G01M 3/20 (2006.01)
(Continued)

(52) U.S. Cl.
CPC .......... G01L 27/002 (2013.01); B81B 7/0009 (2013.01); G01M 3/007 (2013.01);
(Continued)

(58) Field of Classification Search
CPC ...... G01M 3/02; G01M 3/007; G01M 3/3263; G01M 3/207; G01M 3/26; G01L 27/002
See application file for complete search history.

(56) References Cited

U.S. PATENT DOCUMENTS 4,794,784 A * 1/1989 Bley ..................... G01M 3/207
73/1.03
2008/0202210 A1* 8/2008 Liepert ................... G01M 3/20
73/40
(Continued)

FOREIGN PATENT DOCUMENTS

JP 2011047855 * 3/2011 .............. G01M 3/02

OTHER PUBLICATIONS

Machine translation of JP 2011-047855 (Year: 2011).*
(Continued)

Primary Examiner — Natalie Huls
(74) Attorney, Agent, or Firm — Manabu Kanesaka (57) ABSTRACT A static expansion method is performed by expanding a volume of a testing gas from $V_0$ to $V_0+V_1$ between a second chamber of the volume $V_1$ which is connected to an upstream side of a measurement chamber and a first chamber of the volume $V_0$ which is connected to an upstream side of the second chamber, wherein the first camber is in communication with the second chamber via a first valve, wherein the second chamber is in communication with the measurement chamber via each of a second valve and an orifice or porous plug, respectively. When the first valve is opened and the second valve is closed, the testing gas flows from the first chamber via the second chamber into the measurement chamber only through the orifice or porous plug.

4 Claims, 4 Drawing Sheets (51) Int. Cl.
*G01M 3/26* (2006.01)
*G01L 27/00* (2006.01)
*B81B 7/00* (2006.01)

(52) U.S. Cl.
CPC .............. *G01M 3/207* (2013.01); *G01M 3/26* (2013.01); *B81B 2201/05* (2013.01)

(56) References Cited

U.S. PATENT DOCUMENTS

| | | | | |
|---|---|---|---|---|
| 2011/0226043 A1* | 9/2011 | Firpo | ................... | G01M 3/007 73/40 |
| 2014/0053636 A1* | 2/2014 | Ghosh | ................... | G01M 3/007 73/40.5 R |
| 2015/0276541 A1* | 10/2015 | Decker | ................ | G01M 3/007 73/1.58 |
| 2015/0346044 A1* | 12/2015 | Mullis | ................... | G01L 9/0045 73/724 |

OTHER PUBLICATIONS

Greenwood, J., "The Reference Gauge technique for statis expansion ratios—Applied to NPL medium vacuum standard SEA3", Vacuum, Nov. 6, 2006, p. 427-433, vol. 81, No. 4, Elsevier Ltd. (Year: 2006).*

* cited by examiner

STATIC EXPANSION METHOD

CROSS-REFERENCE TO RELATED APPLICATION

This is a continuation application of Ser. No. 14/443,904 filed on May 19, 2015, which is a PCT National Phase of PCT/JP2013/080551 filed on Nov. 12, 2013 claiming a convention priority of Japanese Patent Application No. 2012-254849 filed on Nov. 21, 2012, the disclosure of which is incorporated herein.

TECHNICAL FIELD

The present invention relates to a reference leak generating device and an ultra-fine leak testing device using the reference leak generating device, and is used in, for example, an ultra-fine leak testing for an MEMS package, a crystal oscillator, various semiconductor packages, an infrared sensor package or the like, for which a testing of a very fine leak rate has been required in recent years.

BACKGROUND ART

Conventionally known Kr85 leak testing can be utilized for a leak test up to $10^{-13}$ Pam$^3$/s, but cannot be used in any mass-production machine because radioactive isotopes are used.

Further, for an MEMS package, a test of an ultra-fine leak of $10^{-13}$ Pam$^3$/s or less is required. However, an existing technology is not applicable for a highly reliable calibration, and there is not any standard (reference) for calibration.

For example, in PTL1, there is described a leak gas measuring device which uses a cryopump to measure a fine leak rate from an inspection object filled with helium gas. However, this device is not provided with any calibration means.

Additionally, as a national standard of a leak rate in helium leak testing, $10^{-10}$ Pam$^3$/s of National Institute of Standards and Technology (NIST) is minimum. A helium reference leak having a leak rate of $10^{-11}$ Pam$^3$/s by extrapolation of this standard is sold from U.S. corporations or the like. Therefore, measurement in the range of $10^{-10}$ Pam$^3$/s to $10^{-11}$ Pam$^3$/s or less in helium leak testing is an extrapolation value, and has a low reliability.

In addition, at present, a calibrated helium standard leak is attached to a helium leak testing device. However, since one-point calibration is performed, a linearity of a measuring unit cannot be confirmed.

On the other hand, the present inventors have previously filed applications relating to a calibration method and a calibration device of a microporous filter for standard mixed gas leak (PTL2) and to a reference minute gas flow rate introduction device using a microporous filter (PTL3), concerning the microporous filter which becomes a molecular flow.

CITATION LIST

Patent Literature

PTL1: Japanese Unexamined Patent Publication No. 2004-184207
PTL2: Japanese Unexamined Patent Publication No. 2011-47855
PTL3: Japanese Unexamined Patent Publication No. 2012-154720

SUMMARY OF INVENTION

Technical Problem

Therefore, the present invention has been developed to solve the above problems, and an object thereof is to provide a reference leak generating device which, instead of an extrapolation value, actually generates a reference leak of $10^{-11}$ Pam$^3$/s or less, and also provide an ultra-fine leak testing device in which by use of the reference leak generating device, on the spot, a reference leak is introduced into a measurement chamber of the leak testing device to calibrate a partial pressure analyzer (a mass spectrometer) which detects a leak, thereby achieving a high reliability.

Solution to Problem

In order to solve the above problems, a reference leak generating device according to the present invention introduces a reference leak of $10^{-11}$ Pam$^3$/s or less into a measurement chamber or the like through an orifice, a porous plug or the like having a molecular flow conductance C and pressure conditions to realize a molecular flow which are known in advance. When $p_1 \gg p_2$ is established where an upstream pressure of the orifice or the porous plug is $p_1$ and a downstream pressure thereof is $p_2$, a leak rate Q is a product of C and $p_1$. By making the upstream pressure $p_1$ smaller, the ultra-fine leak rate Q is generated. To precisely determine the upstream pressure $p_1$, a static expansion method is used once or several times.

Further, the upstream pressure $p_1$ is set so that testing gas passing the orifice, the porous plug or the like satisfies molecular flow conditions. When the molecular flow conditions are established, C is a constant, which is beforehand calculated or measured.

Additionally, the ultra-fine leak testing device according to the present invention can directly calibrate a partial pressure analyzer measuring the leak rate, by using the above reference leak generating device to introduce the reference leak of $10^{-11}$ Pam$^3$/s or less by testing gas into the measurement chamber of the leak testing device. When the leak rate is about $10^{-11}$ Pam$^3$/s, it is possible to carry out a test even while discharging testing gas by means of a vacuum pump. Furthermore, there is measured a partial pressure of testing gas when an introduction flow rate and a discharge rate are equilibrated, to measure the leak rate. In this case, even when any inert gas is not used, it is possible to carry out the test.

However, in the case of the ultra-fine leak of $10^{-12}$ Pam$^3$/s or less, a method of introducing testing gas into a vacuum container which is sealed and maintained at a high vacuum to store and measure testing gas is more advantageous in that a measurement sensitivity is enhanced. In this case, an entrapment vacuum pump such as a non-evaporable getter pump or a cryopump is used as the vacuum pump, and inert gas (helium or the like) for which the above entrapment vacuum pump does not have any discharge ability is used as testing gas. When the reference leak is introduced into a fine leak measuring section evacuated by the above entrapment vacuum pump, testing gas is not discharged, and is therefore accumulated in the vacuum container of the fine leak measuring section. An increasing rate of the partial pressure of testing gas is measured by means of the partial pressure analyzer. An output signal of the partial pressure analyzer has a unit of A (ampere), and hence the increasing rate of the partial pressure to be obtained has a dimension of A/s. When the increasing rate is compared with the reference leak having the known leak rate, the dimension can be converted to a unit (Pam$^3$/s, g/s, mol/s, number/s, atm-cc/s or the like) indicating an absolute value of the leak rate, and calibration can be performed.

Next, by a vacuum spray method, a vacuum hood method, a pressure vacuum method (a bombing method) or the like, testing gas released from a test piece is introduced into a vacuum device evacuated by the same non-evaporable getter pump or cryopump, and a partial pressure increase of testing gas at this time is measured with the calibrated partial pressure analyzer, thereby measuring the leak rate.

That is, the reference leak generating device according to the present invention is a reference leak generating device adapted to be connected to an upstream side of a measurement chamber, and includes a chamber connected to the measurement chamber through an orifice or a porous plug having a molecular flow conductance C and a pressure to establish molecular flow conditions which are known in advance, a pressure $p_1$ of testing gas to be introduced into the chamber being precisely determined by using a static expansion method once or more times, and being set so that testing gas flowing through the orifice or the porous plug satisfies the molecular flow conditions, and a leak rate of a reference leak at the pressure $p_1$ being obtained in accordance with a product of C and $p_1$.

The present invention is also characterized in that in the reference leak generating device, the static expansion method is performed by expanding a volume of testing gas from $V_0$ to $V_0+V_1$ between a second chamber of the volume $V_1$ which is connected to the upstream side of the measurement chamber and a first chamber of the volume $V_0$ which is connected to an upstream side of the second chamber.

Further, the present invention provides an ultra-fine leak testing device or an outgassing measurement device including a reference leak generating section constituted of the above reference leak generating device and a fine leak measuring section, the fine leak measuring section including a measurement chamber for measuring a leak or an outgassing from a test piece, a partial pressure analyzer connected to the measurement chamber, and an entrapment vacuum pump connected to the measurement chamber and adapted not to discharge testing gas, the reference leak generating section comprising, on the upstream side of the measurement chamber, the chamber connected to the measurement chamber through the orifice or the porous plug having the molecular flow conductance C and the pressure to establish the molecular flow conditions which are known in advance, wherein the pressure $p_1$ of testing gas to be introduced into the chamber is precisely determined by using the static expansion method once or more times, and is set so that testing gas flowing through the orifice or the porous plug satisfies the molecular flow conditions, the leak rate of the reference leak at this time is obtained in accordance with the product of C and $p_1$, an increasing rate of a partial pressure of testing gas is measured with the partial pressure analyzer, and an increasing rate of an output signal of the partial pressure analyzer is compared with the leak rate of the reference leak to perform calibration.

The present invention is also characterized in that in the ultra-fine leak testing device or the outgassing measurement device, testing gas is inert gas such as helium or the like.

Additionally, the present invention provides an ultra-fine leak testing device or an outgassing/permeation measurement device including a reference leak generating section constituted of the above reference leak generating device and a fine leak measuring section, the fine leak measuring section including a measurement chamber for measuring a leak or an outgassing from a test piece, a partial pressure analyzer connected to the measurement chamber, and a kinetic vacuum pump connected to the measurement chamber, the reference leak generating section including, on the upstream side of the measurement chamber, the chamber connected to the measurement chamber through the orifice or the porous plug having the molecular flow conductance C and the pressure to establish the molecular flow conditions which are known in advance, wherein the pressure $p_1$ of testing gas to be introduced into the chamber is precisely determined by using the static expansion method once or more times, and is set so that testing gas flowing through the orifice or the porous plug satisfies the molecular flow conditions, the leak rate of the reference leak at this time is obtained in accordance with the product of C and $p_1$, and a partial pressure of testing gas in equilibrium conditions which is measured with the partial pressure analyzer is compared with the leak rate of the reference leak to perform calibration.

Advantageous Effects of Invention

According to the reference leak generating device of the present invention, instead of an extrapolation value, a reference leak of $10^{-11}$ Pam$^3$/s or less can precisely be generated on the spot, and according to the ultra-fine leak testing device of the present invention, the reference leak can be introduced into the leak testing device on the spot, to carry out a test while confirming that measurement can be performed, thereby achieving a high reliability.

Further, according to the ultra-fine leak testing device of the present invention, instead of one-point calibration, it is possible to carry out multipoint calibration, and hence a linearity of a partial pressure analyzer (a mass spectrometer) which measures a leak rate can be confirmed.

In addition, according to the ultra-fine leak testing device of the present invention, any radioactive substance is not used, a device constitution is not complicated, and hence the device can be applied to a mass production machine.

DESCRIPTION OF EMBODIMENTS

Figure 1:
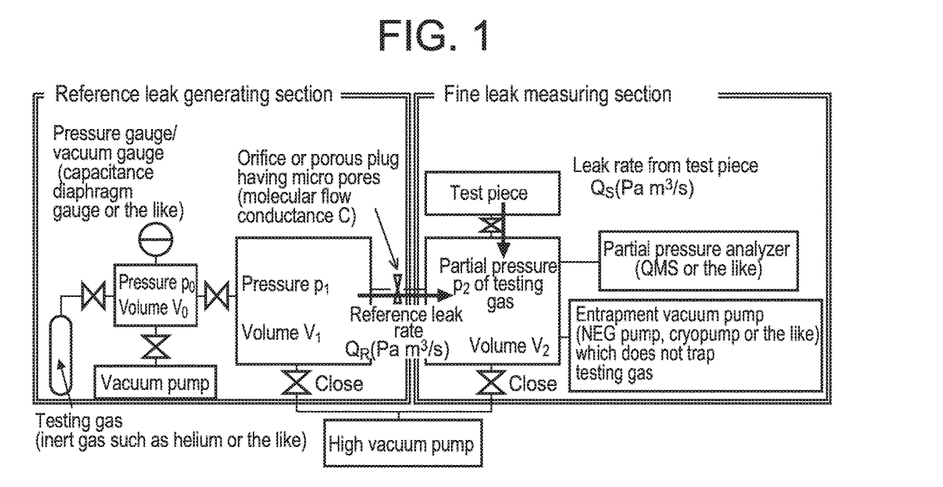
FIG. 1 is an explanatory view schematically showing a reference leak generating device according to the present invention and an ultra-fine leak testing device using the reference leak generating device.

FIG. 1 shows a schematic view of a reference leak generating device according to the present invention, and an ultra-fine leak testing device according to the present invention which uses the reference leak generating device as a reference leak generating section. As shown in the drawing, the ultra-fine leak testing device has the reference leak generating section and a fine leak measuring section. The ultra-fine leak testing device includes a first chamber of a volume $V_0$, a second chamber of a volume $V_1$, and a measurement chamber of a volume $V_2$. Pressures of the second chamber and the measurement chamber are represented by $p_1$, $p_2$, and $p_0$ is an initial pressure of testing gas before expansion which is measured with a pressure gauge or a vacuum gauge such as a capacitance diaphragm gauge when the testing gas (an inert gas such as helium or the like) is introduced into the first chamber.

By repeating a static expansion method (in which $V_0$ is expanded to $(V_0+V_1)$) in the reference leak generating section constituting the reference leak generating section, the pressure $p_1$ can precisely be determined to a low pressure, and $p_1$ can precisely be determined in accordance with:

$$p_1 = \{V_0/(V_0+V_1)\}^n p_0,$$

in which n is the number of times of expansion. At this time, the pressure $p_1$ is set so that the testing gas flowing through an orifice or a porous plug satisfies molecular flow conditions.

Testing gas is introduced from the second chamber to the measurement chamber of the fine leak measuring section through the orifice or the porous plug in which a molecular flow conductance C and a pressure to establish the molecular flow conditions are clarified. C is calculated or measured in advance.

The pressure of the measurement chamber is measured with a partial pressure analyzer (QMS or the like), and the measurement chamber is evacuated by an entrapment vacuum pump (a non-evaporable getter (NEG) pump, a cryopump or the like) which does not discharge testing gas. At this time, a reference leak rate $Q_R$ (Pa·m$^3$/s) from the second chamber to the measurement chamber can be obtained in accordance with Equation (1).

$$Q_R = Cp_1 = C \cdot \{V_0/(V_0+V_1)\}^n p_0 \quad (1)$$

On the other hand, when a leak rate $Q_S$ (Pa·m$^3$/s) from a test piece is measured in the fine leak measuring section, an ultra-fine leak is measured with the partial pressure analyzer. At this time, impurity gas other than testing gas is discharged by the non-evaporable getter pump, and the partial pressure analyzer is set to be suitably operable, to measure only testing gas (helium or the like). The reference leak rate $Q_R$ is compared with the leak rate $Q_S$ from the test piece, to quantitatively measure $Q_S$. Helium gas is not discharged by the entrapment vacuum pump such as the NEG pump or the cryopump, and hence a partial pressure of testing gas monotonously increases and can therefore be obtained in accordance with Equation (2).

$$Q_S = V_2 \cdot (dp_2/dt) \quad (2)$$

An increasing rate of the helium partial pressure is measured with the partial pressure analyzer. At this time, impurity gas released from the chamber or the like is discharged by the entrapment vacuum pump (the NEG pump, the cryopump or the like) which does not discharge testing gas, and therefore the partial pressure analyzer can operate at a suitable pressure.

It is noted that an ultra-fine leak rate from the test piece includes, for example, a leak of a filling gas (e.g., helium or the like) from a gas filling package or the like, and an outgassing from a material or the like.

EXAMPLE

Figure 2:
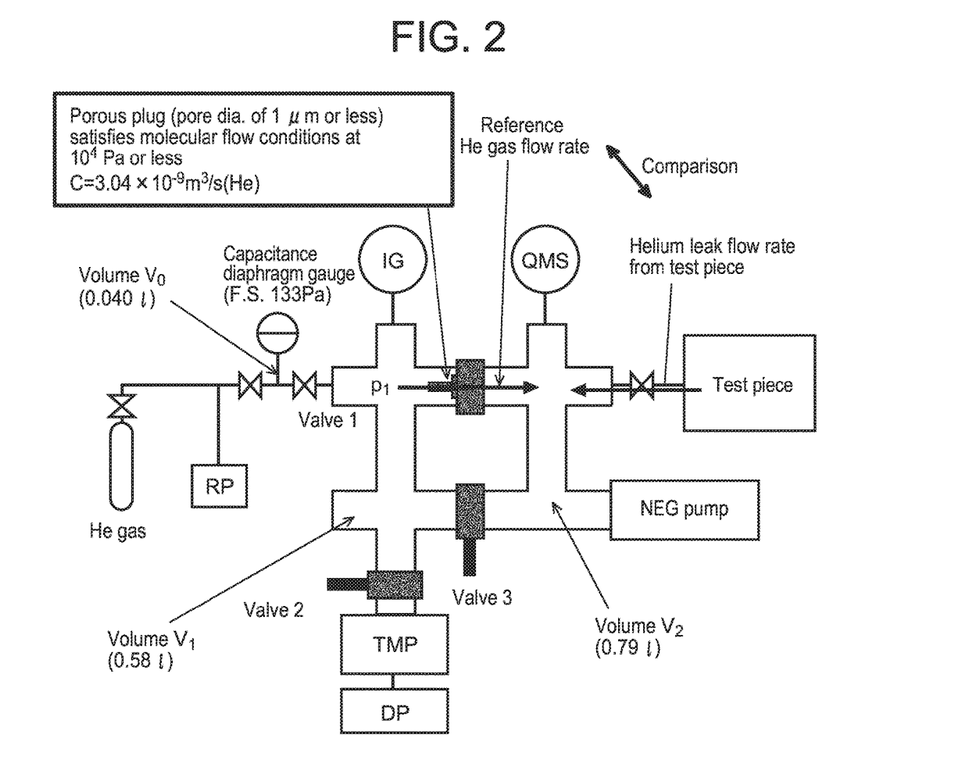
FIG. 2 is a view showing an embodiment of the reference leak generating device according to the present invention and the ultra-fine leak testing device using the reference leak generating device.

FIG. 2 shows an embodiment of a reference leak generating device according to the present invention, and an ultra-fine leak testing device according to the present invention which uses the reference leak generating device as a reference leak generating section. Abbreviations in the drawing indicate QMS: a quadrupole mass spectrometer, IG: an ionization gauge, NEG pump: a non-evaporable getter pump, RP: a rotary pump, TMP: a turbo molecular pump, DP: a dry pump, and a capacitance diaphragm gauge (F.S. 133 Pa): a capacitance diaphragm gauge having a full scale of 133 Pa.

The device is divided into a first chamber of a volume $V_0$, a second chamber of a volume $V_1$, and a measurement chamber of a volume $V_2$. The capacitance diaphragm gauge for measuring a helium pressure before expansion is attached to the first chamber, the IG for measuring a background pressure is attached to the second chamber, and the QMS for measuring helium and the NEG pump for discharging impurity gas other than helium are attached to the measurement chamber.

The first chamber can be closed by using two front and rear valves. The second chamber can be made in a closed state by closing a valve 1, a valve 2 and a valve 3. Afterward, by opening the valve 1, helium stored in the first chamber is expanded to the second chamber. The second chamber is connected to the measurement chamber through a porous plug and the valve 3, and by closing the valve 3, helium can be introduced from the second chamber into the measurement chamber only through the porous plug.

Calibration of the QMS is performed in a state where the valve 3 is closed. By helium flowing into the measurement chamber through the porous plug, a helium partial pressure in the measurement chamber increases, and hence an increasing rate of the partial pressure is measured with the QMS. On the other hand, a flow rate of helium flowing into the measurement chamber can precisely be obtained in accordance with Equation (1):

$$Q_R = Cp_1 = C \cdot \{V_0/(V_0+V_1)\}^n p_0.$$

Therefore, the partial pressure increasing rate of helium which is measured with the QMS is compared with the introduction flow rate of helium which is obtained in accordance with the above equation, so that the QMS can be calibrated. During this calibration, impurity gas released from a wall or the like in the measurement chamber is discharged by the NEG pump, and therefore the helium partial pressure measurement is not disturbed.

Next, leak testing of a test piece is carried out. As a method of leak testing, a vacuum spray method, a vacuum hood method, or a pressure vacuum method (a bombing method) is applicable. During this testing, the valve 3 is beforehand closed in the same manner as in the calibration. When there is a leak, the helium partial pressure in the measurement chamber increases due to helium leaking out from the test piece. From the increasing rate of the helium partial pressure and the above calibration result, a leak rate from the test piece can be measured. Since volumes of the test piece and a connecting tube also have an influence on the increasing rate of the helium partial pressure, these volumes should be separately obtained in advance as required.

Figure 3:
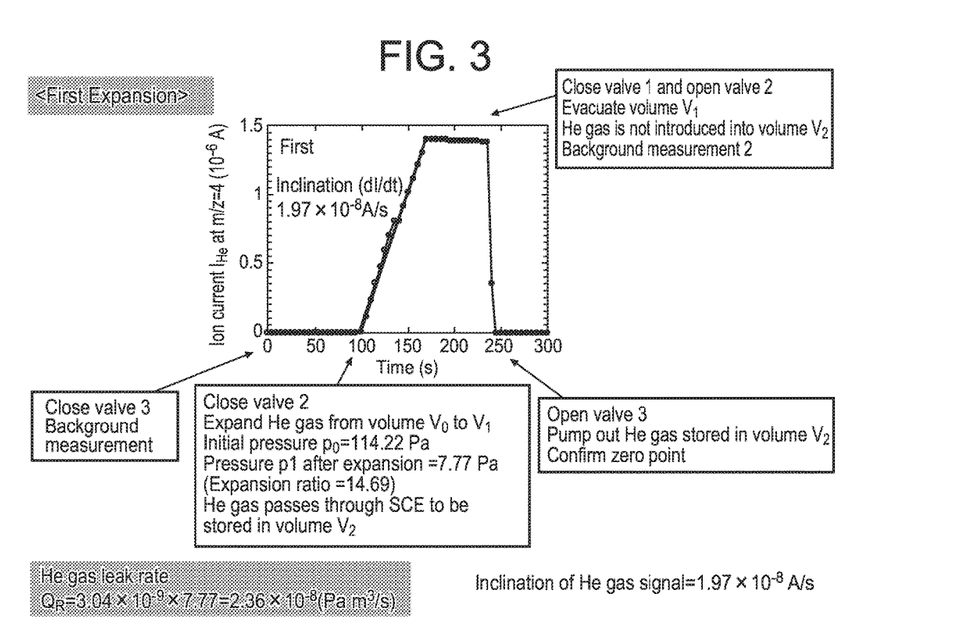
FIG. 3 is a diagram for explaining first expansion of a static expansion method.

In FIG. 3, the result of first expansion is shown.

The valve 3 was closed to perform background measurement.

The valve 2 was closed to expand He gas from a volume $V_0$ to $V_0+V_1$. At this time, an initial pressure $p_0=114.22$ Pa, a pressure $p_1$ after the expansion=7.77 Pa, and an expansion ratio=14.69, and He gas passed through the porous plug to be stored in a volume $V_2$.

The valve 1 was closed, the valve 2 was opened, the volume $V_1$ was evacuated, and He gas was not introduced into the volume $V_2$. Background measurement 2 was performed.

The valve 3 was opened, He gas stored in the volume $V_2$ was pumped out, and a zero point was confirmed.

A leak rate of He gas was $$Q_R=3.04\times10^{-9}\times7.77=2.36\times10^{-8} \text{ (Pam}^3\text{/s)},$$

and the increasing rate (an inclination) of a He gas signal was $1.97\times10^{-8}$ (A/s). At this time, a secondary electron multiplier of the QMS was set to ON.

Figure 4:
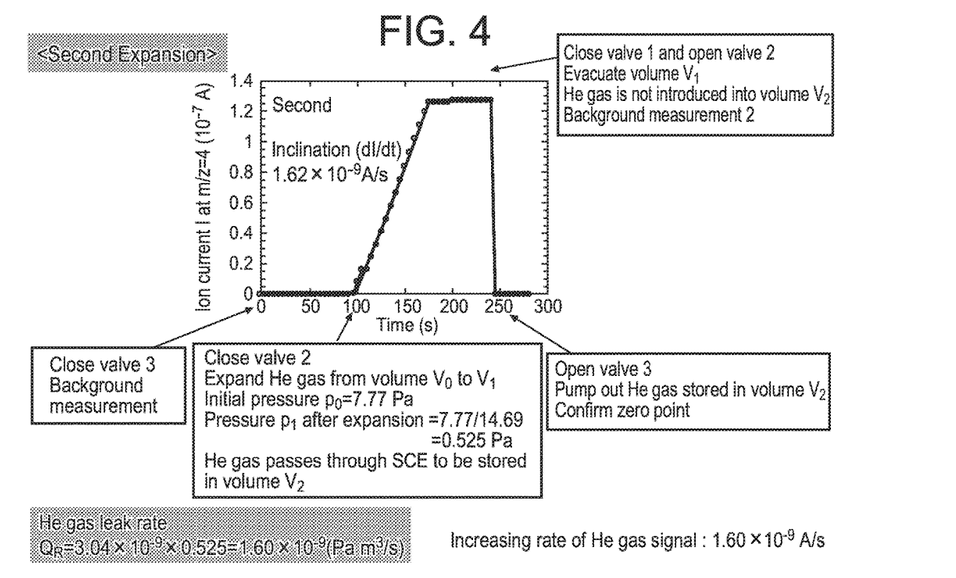
FIG. 4 is a diagram for explaining second expansion of the static expansion method.

In FIG. 4, the result of second expansion is shown.

Similarly to the first time, the valve 3 was closed to perform the background measurement.

The valve 2 was closed to expand He gas from the volume $V_0$ to $V_0+V_1$. At this time, an initial pressure $p_0=7.77$ Pa ($P_0$ herein was used to indicate the pressure of the first chamber before the second expansion), the pressure $p_1$ after the expansion=7.77/14.69=0.525 Pa, and He gas passed through the porous plug to be stored in the volume $V_2$.

The valve 1 was closed, the valve 2 was opened, the volume $V_1$ was evacuated, and He gas was not introduced into the volume $V_2$. The background measurement 2 was performed.

The valve 3 was opened, He gas stored in the volume $V_2$ was pumped out, and the zero point was confirmed.

The leak rate of He gas was $$Q_R=3.04\times10^{-9}\times0.525=1.06\times10^{-9} \text{ (Pam}^3\text{/s)},$$

and the increasing rate (the inclination) of the He gas signal was $1.60\times10^{-9}$ (A/s).

Figure 5:
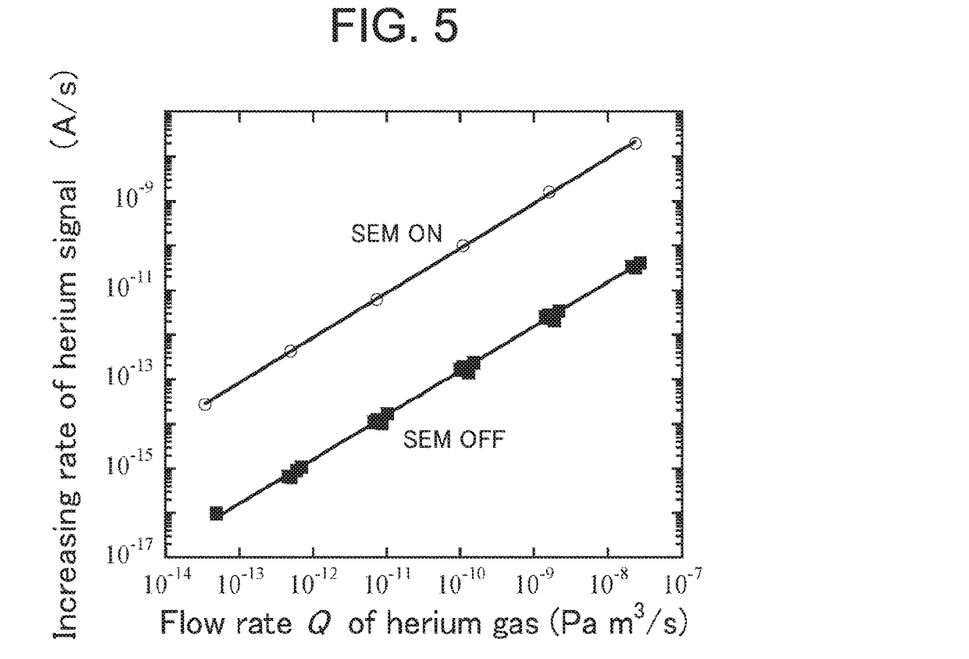
FIG. 5 is a diagram showing, in double logarithmic scale, a relation between an introduction flow rate and an increasing rate when an expanding operation is repeated.

FIG. 5 is a graph in which the results obtained when the expanding operation was repeated six times are plotted on double logarithmic scale with the vertical axis indicating the increasing rate (A/s) of the helium signal and the horizontal axis indicating the introduction flow rate $Q_R$ (Pam$^3$/s) of helium. It is shown that the increasing rate of the He gas signal enlarges in proportion to the introduced leak rate $Q_R$. Similarly, there are also plotted in FIG. 5 the results of the measurement in a state where the secondary electron multiplier (SEM) of the QMS was set to OFF. It is shown that an obtained ion current (A) becomes smaller, but similarly, a proportional relation is obtained.

Figure 6:
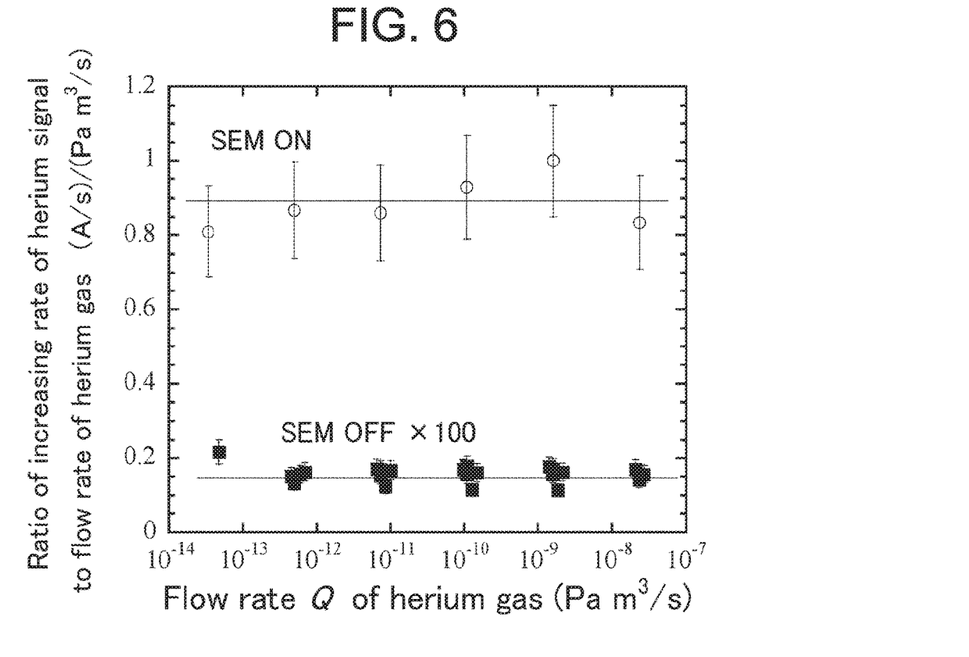
FIG. 6 is a diagram showing a ratio between the introduction flow rate and the increasing rate when the expanding operation is repeated.

FIG. 6 is a graph in which the vertical axis indicates a ratio (A/s)/(Pam$^3$/s) between the increasing rate of the helium gas signal and the introduction flow rate, and the horizontal axis indicates the introduction flow rate $Q_R$ (Pam$^3$/s) of helium. It is shown that a relative ratio between $Q_R$ and the increasing rate of the He gas signal is constant, i.e., results of an introduction rate and a measurement rate are matched. This also applies to the result of the measurement in the state where the secondary electron multiplier of the QMS was set to OFF (the result multiplied by 100 times is also plotted).

Therefore, an output signal of the partial pressure analyzer has a unit of A (ampere), and hence the increasing rate of the partial pressure to be obtained has a dimension of A/s, but when the increasing rate is compared with the reference leak with the known leak rate, the dimension can be converted to a unit (Pam$^3$/s, g/s, mol/s, number/s, atm-cc/s or the like) indicating an absolute value of the leak rate, and this unit can be utilized as a standard during the calibration process.

Figure 7:
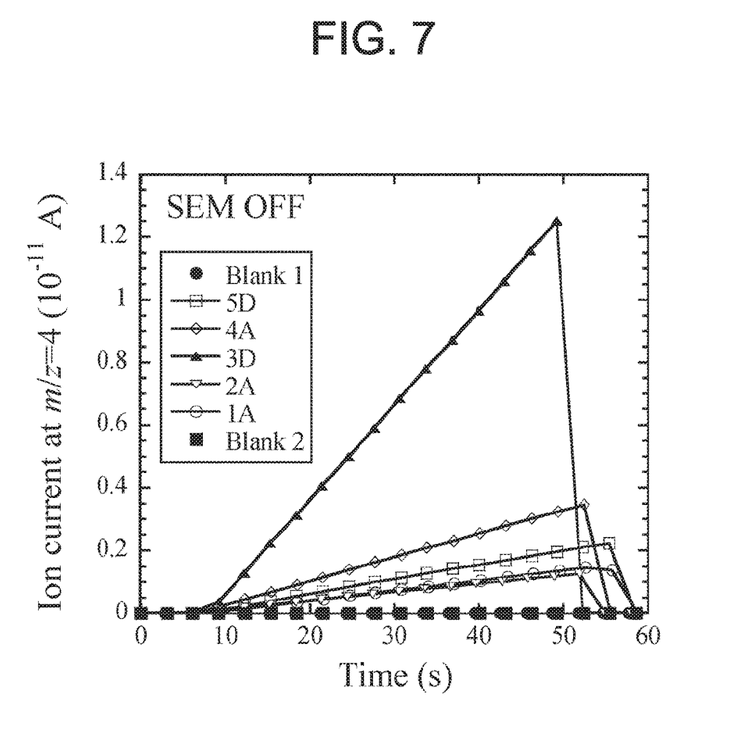
FIG. 7 is a diagram showing the result of a leak inspection of five cylindrical MEMS samples each having a diameter of 0.5 mm and a length of 4 mm by use of the present invention.

There will be described below the result of a leak inspection of five cylindrical MEMS samples each having a diameter of 0.5 mm and a length of 4 mm by use of the present invention. By using a separate device, MEMS samples were exposed (subjected to a bombing) in helium gas of three atmospheres for 94 hours after evacuation. Subsequently, within 50 minutes after opening to the atmospheric air, Each of the MEMS samples exposed in helium gas was introduced into the test piece chamber shown in FIG. 2. After the evacuation, the valve 3 was closed, and an increase of the He gas signal was measured with the partial pressure analyzer. The result is shown in FIG. 7. For comparison, there is also shown in FIG. 7 the results of two blank tests (the result when the MEMS sample was not disposed in the test piece chamber) which were carried out before and after the measurement of the MEMS sample. The secondary electron multiplier of the QMS was set to OFF.

From FIG. 7, it is seen that the increasing rate of helium obtained from a sample number 3D is clearly larger than those obtained from the other sample numbers. This is because "a leak" was present in the sample number 3D, helium gas permeated into the MEMS during the process of being exposed in helium gas of three atmospheres, and the penetrating helium gas was released again in the device of FIG. 2. The increasing rate of helium is $2.88\times10^{-13}$ A/s, and hence according to the calibration result (FIG. 5), a size of the leak can quantitatively be determined as $1.87\times10^{-10}$ Pa/m$^3$·s. In the results of the other four samples (1A, 2A, 4A and 5D), as compared with the test results of the blanks, the increasing rate of helium became slightly larger, but this is supposedly because helium gas permeated into glass used in a sealing material of the MEMS. Consequently, it has been confirmed that by use of the present invention, a fine leak of order of $10^{-10}$ Pa/m$^3$·s can easily, quantitatively be measured for an inspection time of about 60 seconds.

In the above description of the embodiment, the entrapment vacuum pump is used and the case where helium is used has been described. However, it is obvious that the present invention is applicable to the case where another inert gas is used.

(Modification)

Further, the reference leak generating device according to the present invention can be used in combination with a measuring section in which a kinetic vacuum pump such as a turbo molecular pump or the like is used instead of the entrapment vacuum pump. As described above in paragraph 0005, when a leak rate is about $10^{-11}$ Pam$^3$/s, it is possible to carry out a test while pumping out testing gas by the vacuum pump, and there is measured a partial pressure of testing gas when an introduction flow rate and an effective pumping-out speed are equilibrated, so that the leak rate can be measured. In this case, testing gas having a known flow rate is introduced into the measuring section, and there is measured the partial pressure of testing gas when the introduction flow rate and the effective pumping-out speed are equilibrated, to perform the measurement of the leak rate and calibration of a partial pressure analyzer. In a method in which the kinetic vacuum pump is used, even when gas other than inert gas is used, it is possible to measure the leak rate, but a measurement lower limit becomes higher as compared with the above method of the embodiment in which the entrapment vacuum pump is used. When an outgassing or gas permeation from a material or the like is measured, there is a high possibility that gas other than inert gas is released, and hence the kinetic vacuum pump is more suitably used.

What is claimed is:

1. A method comprising:
   providing a reference leak generating device which is connected to an upstream side of a measurement chamber, wherein the reference leak generating device comprises a first chamber connected to the measurement chamber through an orifice or a porous plug having a molecular flow conductance C and a pressure to establish molecular flow conditions which are known in advance,
   determining a pressure $p_1$ of testing gas which is introduced into the first chamber by a static expansion method one or more times, wherein the pressure $p_1$ is set so that the testing gas flowing through the orifice or the porous plug satisfies the molecular flow conditions, and
   obtaining a leak rate of a reference leak at the pressure $p_1$ in accordance with a product of C and $p_1$,
   wherein the static expansion method is performed by expanding a volume of the testing gas from $V_0$ to $V_0+V_1$ between a second chamber of the volume $V_1$ which is connected to the upstream side of the measurement chamber and the first chamber of the volume $V_0$ which is connected to an upstream side of the second chamber, wherein the first camber is in communication with the second chamber via first valve, wherein the second chamber is in communication with the measurement chamber via each of a second valve and the orifice or porous plug, respectively, and wherein, when the first valve is opened and the second valve is closed, the testing gas flows from the first chamber via the second chamber into the measurement chamber only through the orifice or porous plug.

2. The method according to claim 1, wherein said providing comprises providing
   an ultra-fine leak testing device or an outgassing measurement device, one of the ultra-fine leak testing device or the outgassing measurement device comprising a reference leak generating section constituted of the reference leak generating device, and a fine leak measuring section,
   said fine leak measuring section including said measurement chamber for measuring a leak or an outgassing from a test piece, a partial pressure analyzer connected to the measurement chamber, and an entrapment vacuum pump connected to the measurement chamber and adapted not to discharge the testing gas,
   said reference leak generating section comprising, on the upstream side of the measurement chamber, the second chamber connected to the measurement chamber through the orifice or the porous plug having the molecular flow conductance C and the pressure to establish the molecular flow conditions which are known in advance,
   wherein the method further comprises measuring an increasing rate of a partial pressure of the testing gas with the partial pressure analyzer, and comparing an increasing rate of an output signal of the partial pressure analyzer with the leak rate of the reference leak to perform calibration.

3. The method according to claim 2, wherein the testing gas is an inert gas.

4. The method according to claim 1, wherein said providing comprises providing
   an ultra-fine leak testing device or an outgassing/permeation measurement device, one of the ultra-fine leak testing device or the outgassing/permeation measurement device comprising a reference leak generating section constituted of the reference leak generating device, and a fine leak measuring section,
   said fine leak measuring section including said measurement chamber for measuring a leak or an outgassing from a test piece, a partial pressure analyzer connected to the measurement chamber, and a kinetic vacuum pump connected the measurement chamber,
   said reference leak generating section comprising, on the upstream side of the measurement chamber, the second chamber connected to the measurement chamber through the orifice or the porous plug having the molecular flow conductance C and the pressure to establish the molecular flow conditions which are known in advance,
   wherein the method further comprises measuring a partial pressure of the testing gas in equilibrium conditions which is measured with the partial pressure analyzer and comparing said partial pressure with the leak rate of the reference leak to perform calibration.

* * * * *